United States Patent [19]

Marhic

[11] 4,068,112
[45] Jan. 10, 1978

[54] VALVE FOR AN ELECTRON BOMBARDMENT WELDING MACHINE AND MACHINE FITTED WITH SUCH VALVE

[75] Inventor: Gerard Marhic, Chaumont-en-Vexin, France

[73] Assignee: Commissariat a l'Energie Atomique, Paris, France

[21] Appl. No.: 712,895

[22] Filed: Aug. 9, 1976

[30] Foreign Application Priority Data

Aug. 26, 1975  France .................................. 75.26205

[51] Int. Cl.² ............................................. B23K 15/00
[52] U.S. Cl. ................................. 219/121 EB; 251/31; 251/63
[58] Field of Search ................. 219/121 EB, 121 EM; 251/31, 63; 250/492

[56] References Cited

U.S. PATENT DOCUMENTS

| | | | |
|---|---|---|---|
| 3,150,257 | 9/1964 | Wilska | 219/121 EB |
| 3,169,183 | 2/1965 | Radkte et al. | 219/121 EB |
| 3,426,799 | 2/1969 | Kintner | 251/31 X |
| 3,454,740 | 7/1969 | Foulquier et al. | 219/121 EM |
| 3,529,123 | 9/1970 | Hinrichs | 219/121 EB |
| 3,635,436 | 1/1972 | Tillman | 251/31 |
| 3,773,082 | 11/1973 | Davis | 251/31 X |
| 3,887,784 | 6/1975 | Alais et al. | 219/121 EM |
| 3,890,991 | 6/1975 | Grove et al. | 251/31 |
| 3,985,154 | 10/1976 | Hargraves | 251/31 X |

FOREIGN PATENT DOCUMENTS 419,378  2/1967  Sweden .......................... 219/121 EB Primary Examiner—J. V. Truhe
Assistant Examiner—Mark Paschall
Attorney, Agent, or Firm—Lee C. Robinson, Jr.

[57] ABSTRACT

A valve which preserves the vacuum between a gun and a welding enclosure in an electron-bombardment.

The valve contains a chamber which communicates with the gun and the enclosure via opposing orifices, with a sliding piston provided with a passage coming into line with the orifices when the valve is in the open, or welding position, the piston being actuated by means employing fluid.

The invention is applicable to electron-bombardment welding machines and in particular to machines fitted with visual means for inspecting the parts to be welded.

13 Claims, 3 Drawing Figures

VALVE FOR AN ELECTRON BOMBARDMENT WELDING MACHINE AND MACHINE FITTED WITH SUCH VALVE

BACKGROUND OF THE INVENTION

The present invention relates to a vacuum isolating valve for an electron-bombardment welding machine, of the type having a welding enclosure to receive work parts to be welded, a gun which emits a beam of electrons and focuses it on the parts, and means for creating a vacuum in both the enclosure and the gun, the valve being adapted to occupy an open, welding position in which it opens communication between the enclosure and the gun and allows electrons to pass, and a closed, non-welding position in which it breaks such communication and allows the work parts to be inspected and, if necessary, inserted, withdrawn or adjusted in the enclosure.

In machines of this kind which are known at present, the welding enclosure and the volume of space within the gun, that is, the gun housing which contains the cathode, the surrounding cylinder and the anode, generally are divided into two separate spaces between which a transverse dividing partition is provided, the central part of this partition being provided with an orifice for the electrons emitted by the cathode to pass through. While the electrons are passing, i.e., during welding, a high vacuum needs to prevail in these two spaces, the vacuum being of the order of $10^{-5}$ mm of mercury for the gun housing and $10^{-2}$ mm of mercury for the enclosure; any higher pressure would soon lead to the electrons scattering. The vacuum is generated and maintained by suitable pumping means such as two separate pumps which are assigned in the one case to the welding enclosure and in the other to the gun. To enable the enclosure to be opened (and thus the pressure in it to be raised to atmospheric) whenever it is necessary to gain access to it in order to introduce or withdraw parts, but at the same time so that this can be done without affecting the vacuum within the gun, the orifice through which pass the electrons is fitted with a vacuum-tight valve which enables the orifice to be blocked and the gun to be thus isolated from the enclosure.

Such welding machines may also be equipped with an optical arrangement for insepcting the parts to be welded, which may be formed by a light source, a viewing device such as a magnifier, and a system of mirrors or the like which reflect light from the source onto the parts to be welded along the axis of the electron beam, and then return the light which is reflected by these parts to the viewing device, which enables the electron beam to be accurately lined up with the joint line between the parts before the welding operation and also enables the quality or standard of the welds to be checked visually.

Certain of the valves in current use are ones which contain a rotary valve body provided with a passage. In the case of machines fitted with an optical inspection arrangement, the said mirrors are mounted on the rotary valva body. Depending on the angular position of the valve body, the valve is either in the open, or welding, position, when the passage is lined up with the electron beam orifice to allow the electrons to pass while providing communication between the gun and enclosure, or in the closed position, when the electron beam orifice is blocked (the electron beam having previously been cut off) while the mirror system lies on the optical path of the optical inspection system, thus enabling the parts to be viewed. The rotary valve body must occupy a precise angular position if it is to provide a perfect seal and an accurate line of sight. If there is any divergence from this position, as a result of friction for example, there is a danger of leaks arising and the line of sight being incorrect.

Also known are so-called slide valves which are formed in essence by a core or slider which is slidably moved by a linkage system. Such valves have serious disadvantages one of which is that the linkage mechanism is complicated and costly to construct, is easily upset and is not very easy to operate. The mechanism is also subject to jamming and play.

It is an object of the invention to provide a valve which is of simple and economical construction and is reliable in operation.

SUMMARY OF THE INVENTION

To this end, the invention provides a valve for use in an electron-bombardment welding device, which valve is formed of a valve body provided with a chamber which communicates, via opposing orifices co-axial with the electron beam, with the housing containing the gun and with the enclosure for the work parts, a member which slides in the chamber perpendicularly to the electron beam and which is provided with a contact face which rests in sealed relation against one of the orifices, the member having a straight passage perpendicular to the member's direction of translatory (i.e., sliding) motion which opens onto the contact face, the passage lining up with the orifices when the valve is in the open position, and employing fluid means to move the sliding member in translation.

In accordance with another feature of the invention, the valve body is formed of a block of metal which is provided with at least two bores whose axes intersect, the first of these bores being perpendicular to the electron beam and forming the afornementioned chamber, and the second being co-axial with the beam and forming the aforementioned orifices.

Such a valve body has the advantage of being robust, and simple and economical in construction.

In accordance with yet another feature of the invention, the aforementioned sliding member is in the form of a double piston which has two heads arranged one on either side of the second bore. The heads are joined together by a connecting rod provided with at least one smooth flat area perpendicular to the axis of the second bore, which forms the aforementioned contact face.

Besides forming a seal, the flat area also guides the double piston and prevents it from turning on its axis.

Furthermore, a part of the lengthwise extent of both heads of the piston, situated in the vicinity of their free ends, is in direct contact with the wall of the chamber, while the remaining portion of the heads situated in the vicinity of the rod, is of smaller diameter and is fitted with sealing rings which make sole contact with the wall of said chamber.

The effect of this division into surfaces for mechanical contact and surfaces for sealing is that wear due to mechanical friction does not affect the seal in any way and thus does not affect the ability of the valve to maintain a vacuum, even after it has been in use for a protracted period of time.

In the case of welding machines provided with an arrangement for visually inspecting the parts to be welded, the aforementioned valve body may contain a third bore whose axis is perpendicular to and meets those of the first and second bores and the aforesaid sliding member is provided with mirrors whose reflective surfaces are arranged parallel to one another and parallel to the direction in which the member moves in translation, the mirrors being adapted to reflect the light rays returned from said metal parts towards the third bore and inspection arrangement.

It can thus be seen that a valve according to the invention overcomes the disadvantages of previous valves.

BRIEF DESCRIPTION OF THE DRAWINGS

Other features and advantages of the invention will become apparent from the following description read in conjunction with the accompanying drawings, which are given merely by way of example, and in which.

DETAILED DESCRIPTION OF A PREFERRED EMBODIMENT

Figure 2:
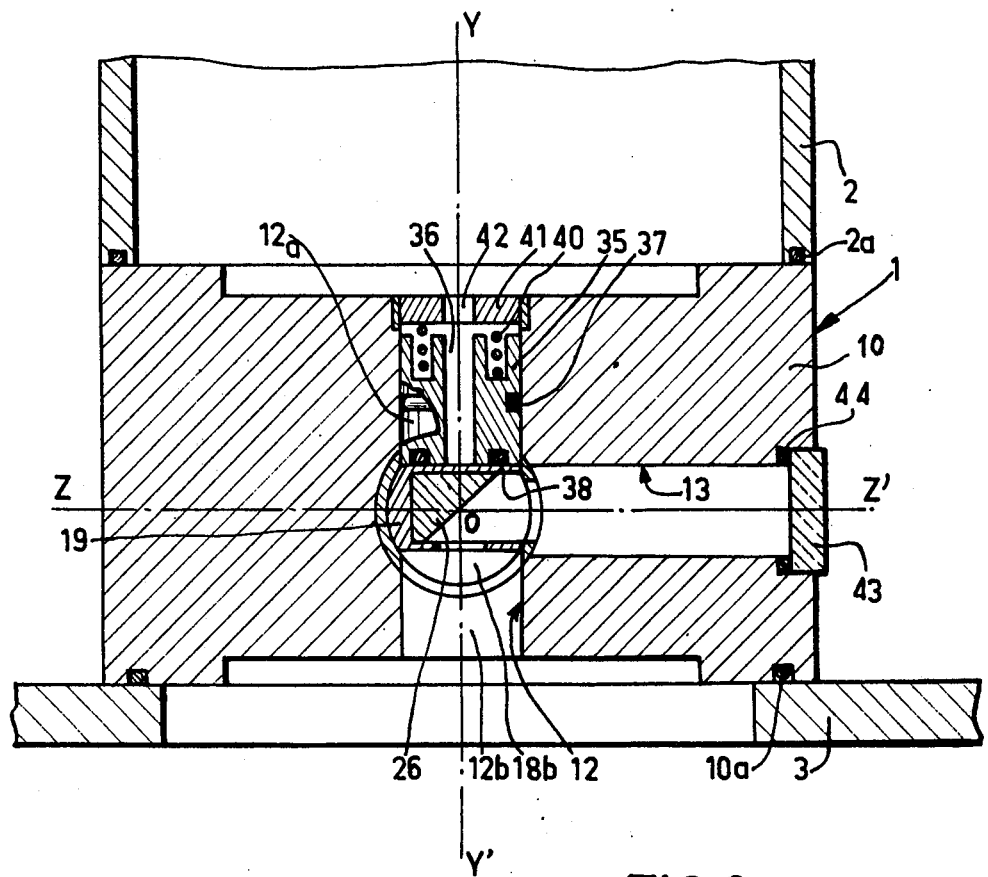
FIG. 2 is a sectional view taken along line II—II of FIG. 1.

In the embodiment shown in the drawings, the valve bears the general reference 1, and is shown inserted between a housing 2 which contains the essential parts of the gun (i.e., the cathode, the surrounding cylinder and the anode) and a welding enclosure 3, the gun and enclosure being included in an electron-bombardment welding machine. The enclosure 3 receives the parts to be welded, which can be introduced or removed through a sealed door (not shown). Also accommodated in enclosure 3 is the lower part of the gun which is fitted with a focussing lens (not shown). The valve 1 has a valve body 10 which is formed by a block of metal. This block bears against the housing 2 and the enclosure 3 via sealing rings 2a and 10a. The body 10 is provided with three bores 11, 12 and 13 (FIG. 2) whose respective axes XX', YY' and ZZ' are perpendicular to one another and meet at a common point O. The three bores are so arranged that the axis XX' of bore 11 is perpendicular to the axis of the electron beam (represented by arrow E) and that the axis YY' of bore 12 is coincident with arrow E. Bore 11, which has a partly cut-away internal liner 14 defines a cylindrical chamber 15, while bore 12 defines on either side of chamber 15 two orifices 12a (FIG. 2) and 12b which open into the interior of the gun housing and the welding enclosure respectively.

Figure 3:
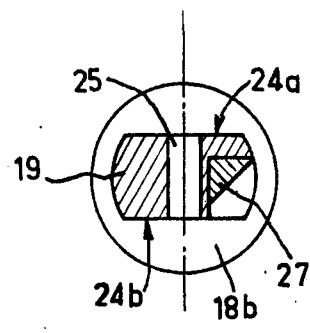
FIG. 3 is a sectional view of the movable member taken along line III—III of FIG. 1.

In the chamber 15 is mounted a sliding member or slider 17 which is in the form of a double piston having two identical heads 18a and 18b. The heads are arranged one on either side of bore 12 and are joined by a connecting rod 19. Near their free ends, the two heads 18a and 18b have parts 20a and 20b which are in direct contact with the inside wall of the liner 14 and which guide and centralise the movable member. Then, in the vicinity of rod 19, they have parts 21a, 21b of smaller diameter, which are thus not in direct contact with the liner 14 but which are fitted with sealing glands 22a, 22b which are in direct contact with liner 14. Rod 19 has two mutually parallel flat areas 24a 24b which are also parallel to axis XX', i.e., to the direction in which member 17 slides, and it has passing through it a straight passage 25 perpendicular to XX' which opens onto the two flat areas 24a and 24b. Rod 19 also carries a first plane mirror 26 which is offset along axis XX' from passage 25 and a second plane mirror 27 (FIG. 3) which is substantially coincident along axis XX' with the said passage 25. Mirrors 26 and 27 are so orientated as to re-direct along axis ZZ' (FIG. 2) the light rays which are reflected by the parts P to be welded, which parts are situated at the bottom of enclosure 3, or to be more precise to re-direct the light rays which are reflected by that portion S of the parts which is situated in the area of impingement of the electrons in the beam, i.e., in the region where the weld is formed. The mirrors are made of polished metal.

At its two ends the chamber 15 is provided with plugs or sealing caps 30a and 30b in which are arranged nozzles 31a and 31b which are connected to a system (not shown) for distributing fluid under pressure, such as compressed air, to move the sliding member 17 in translation. Plugs 30a and 30b are also fitted with mechanical stops 32a and 32b which are intended to restrict the travel of sliding member 17 and in which are housed electrical end-of-travel detectors 33a, 33b. The latter are connected to a safety system (not shown) which is provided to selectively control the pressure in the welding enclosure 3 such that this pressure can be raised to atmospheric pressure when the valve is closed to determine that electrons can be emitted when the valve is open, and to control or participate in various ancillary operations such as the movement of tools for example.

A generally cylindrical seating member 35 provided with an axial channel 36 is housed in sealed relation, by means of a sealing gland 37 (FIG. 2), in part 12a of bore 12. End 35a of seating member 35 bears in sealed relation, by means of a sealing ring 38 concentric with channel 36, against the flat area 24a on the rod 19 of the sliding valve and is pressed against the flat area by a spring 40 which bears against a washer 41. The washer 41 is provided with an opening 42 co-axial with channel 36 and is secured, e.g., screwed, in place at the end of orifice 12a.

Bore 13 (FIG. 2) is sealed off by a transparent window 43 which bears in sealed relation, via a gland 44, against the valve body 10. A viewing device (not shown) such as a magnifier may be mounted on the outside of the valve body co-axially with axis ZZ'.

Figure 1:
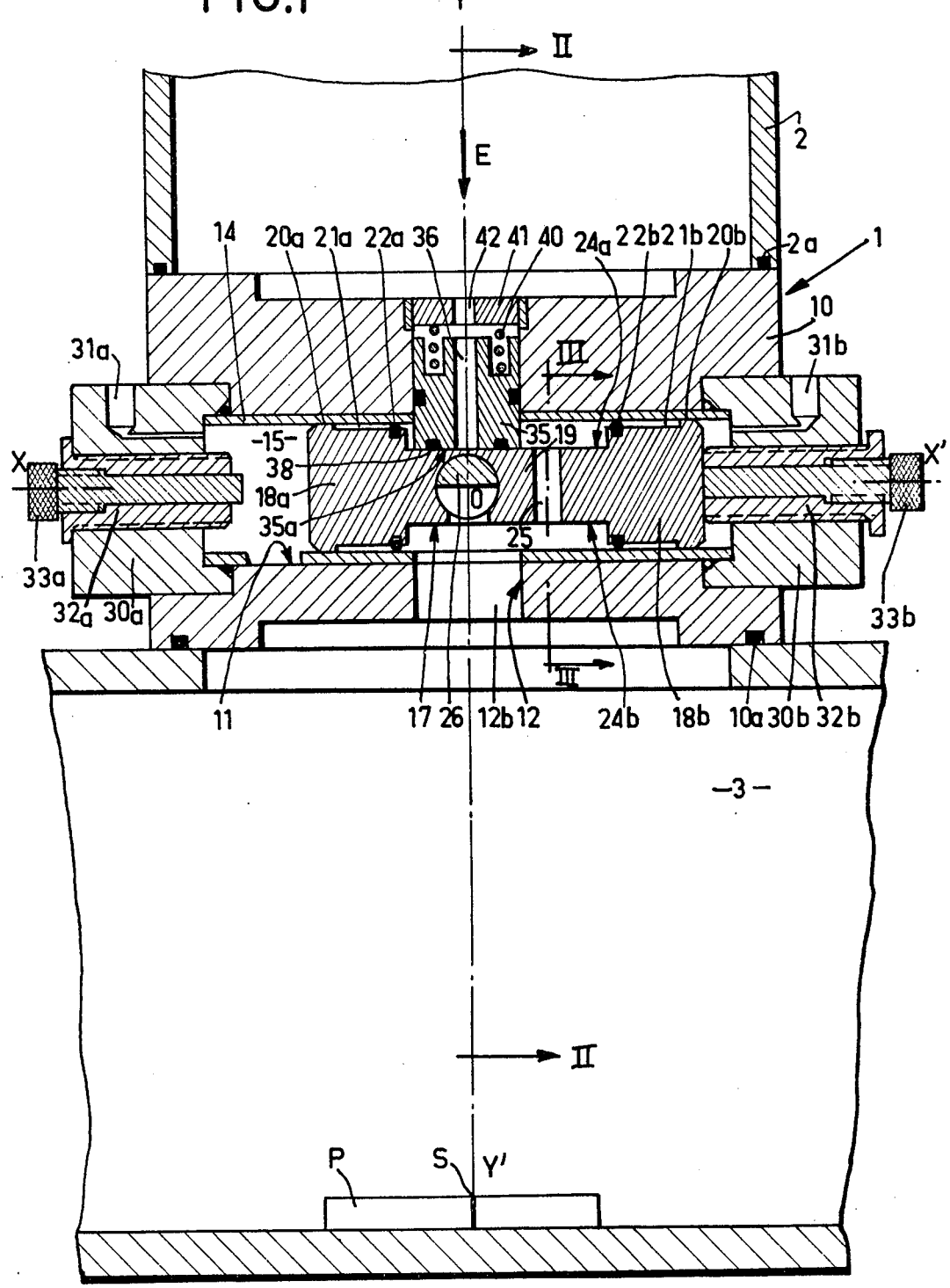
FIG. 1 is a sectional view through one embodiment of a valve in accordance with this invention, the plane of section passing through the axis of the movable member, i.e., the piston.

The travel of sliding member 17 is fixed by the mechanical stops 32a, 32b in such a way that it is able to occupy two positions: a closed position (shown in FIGS. 1 and 2) in which it bears against stop 32b, with the seal between the welding enclosure and the gun housing being provided by glands 37 and 38, and an open position in which it bears against stop 32a and the straight passage 25 is co-axial with axis YY', i.e., is in line with channel 36 and orifice 12. In the closed position, the gun is isolated from the welding enclosure and the pressure in the latter can thus be raised to atmospheric while maintaining the vacuum in the gun. In this closed position the mirror 26, which is centered on axis YY' and whose reflective surface forms an angle of 45° with the vertical, thus re-directs along axis ZZ' towards the magnifier, which lies on a continuation of bore 13, those light rays from a light source (not shown) accommodated in the enclosure which are reflected along the said axis YY' by the portion S of the work P. The operator is thus able to check the standard of the welds visually during non-welding periods or to line up the axis of the electron beam at the desired location along the parts. When the valve is in the open position, mirror 27, which is slightly offset from axis YY′ owing to its position relative to passage 25 and whose reflective surface is suitably inclined to the vertical (at an angle of the order of 47°) re-directs light rays reflected from the welding area to the magnifier and enables the operator to watch the parts as they are being welded.

It should be mentioned that apart from its sealing function seating member 35 is also responsible for guiding the sliding member on an even course, thus preventing it from revolving on its axis and consequently preventing the inclination of the mirrors from varying with respect to the vertical and upsetting the viewing arrangement.

It should also be mentioned that the travel of sliding member 17 is so governed by the stops 32a, 32b that the part of the inside wall of liner 14 which is in direct mechanical contact with the ends 20a, 20b of the piston heads does not overlap with the part of the inside wall of the linear which is in contact with the sealing glands such as 22a. This division between the guiding and sealing functions has the advantage that wear due to mechanical friction has no effect on the ability of the valve to maintain a vacuum and the valve is thus able to be kept in service for long periods.

The invention is not limited to the specific embodiment described and illustrated and many modifications could be made without thereby departing from the scope of the invention as defined by the appended claims. Thus, the sliding member or slider 17 could, for example, be actuated by a liquid rather than compressed air.

I claim:

1. A vacuum isolating valve for an electron-bombardment welding machine which is of the kind comprising a welding enclosure to receive parts to be welded, a gun to emit an electron beam and focus it on said parts, a gun housing to house said gun, and means for generating a vacuum in both said enclosure and said gun housing, said valve being adapted to occupy an open, welding position in which it establishes communication between said enclosure and said gun housing to allow electrons to pass to said parts to be welded, and a closed position in which it terminates said communication to permit said vacuum in said enclosure to be interrupted, said valve comprising a valve body provided with a chamber which communicates, via opposing orifices co-axial with the electron beam when established, with said gun housing and with said enclosure, a slidable member which slides in said chamber perpendicularly to the electron beam and which is provided with a contact face which rests in sealed relation against one of said orifices, said slidable member having a straight passage therethrough perpendicular to the direction of the sliding movement of said slidable member, said passage opening onto said contact face and coming into line with said orifices when said valve occupies said open position, first and second heads disposed at opposite ends of said slidable member interconnected by a rod containing said contact face, an end portion of each said head being in direct contact with the wall of said chamber, the remaining portion of each head disposed between said end portion thereof and said rod being of smaller diameter than said end portion, sealing means disposed on said remaining portion of each head in contact with said wall of said chamber and located a distance from said end portion, which distance is greater than the distance through which said slidable member moves between open and closed valve positions, and means employing fluid to move said slidable member between said open and closed position.

2. A valve according to claim 1, wherein said body is formed by a block of metal and is provided with at least two mutually perpendicular bores whose axes intersect, the first of said bores being perpendicular to said election tion beam and forming said chamber and the second of said bores being co-axial with said beam and forming said two orifices.

3. A valve according to claim 2, which includes a seating member which is housed in sealed relation to that part of said second bore which communicates with said gun housing, said seating member being provided with a channel co-axial with said second of said bores and having an end portion thereof provided with a sealing ring concentric with said channel and in sealed contact with said contact face of said slidable member.

4. A valve according to claim 3, wherein said straight passage in said slidable member passes through said rod offset from the axis of symmetry of said rod and perpendicularly to said contact face, so that when said valve occupies said open position said straight passage lies in line with the channel in said seating member.

5. A valve according to claim 2, for a welding machine of the kind specified which is fitted with an arrangement for inspecting the parts to be welded visually, wherein said body contains a third bore whose axis is perpendicular to and meets the axes of the first and second bores, and said slidable member is fitted with mirrors which are arranged parallel to the direction in which said slidable member moves, said mirrors being adapted to re-direct light rays reflected by the parts to be welded towards said third bore.

6. A valve according to claim 5, wherein said slidable member is provided with a first mirror mounted on said rod offset from the axis of symmetry of said rod and spaced from said passage such that it enables parts on the axis of the electron beam to be viewed when said valve is in the closed position.

7. A valve according to claim 6, wherein said slidable member is provided with a second mirror mounted on said rod in the immediate vicinity of said passage and having an optical path thereto lying in the same plane as the longitudinal axis of said passage to enable parts to be viewed during welding, said first and second mirrors being approximately parallel to each other.

8. A valve according to claim 6, wherein said means employing fluid to move said sliding member in translation are formed by a compressed air circuit which is connected to the two ends of said chamber.

9. A valve according to claim 1, wherein said body is secured to said gun housing and is inserted, in a sealed fashion, between said housing and the focussing lens.

10. A vacuum isolating valve for an electron-bombardment welding device, said valve being disposed between an electron gun housing and a welding enclosure and comprising a valve body provided with a chamber whose longitudinal axis is perpendicular to the electron beam emitted by an electron gun positioned in said gun housing; a first channel between said gun housing and said chamber and coaxial with said beam; a second channel between said chamber and said enclosure and coaxial with said first channel; a double piston slidable in said channel between open and closed positions and having a first flat area to slide in sealing relation with said first channel; a passage through said elongated portion perpendicular to the direction of movement of said piston and offset from an axis of symmetry thereof to be selectively aligned with said first and second channels so as to allow electron beams to pass from said gun housing to said enclosure; a bore in said valve body perpendicular to said chamber and to said first and second channels; a first mirror mounted on said elongated portion offset from said axis of symmetry and spaced from said passage to reflect light from work parts in said welding enclosure through said bore; a second mirror approximately parallel to said first mirror and mounted on said elongated portion to reflect light from said work parts through said bore, said second mirror having an optical path from said work parts lying in the same plane as the longitudinal axis of said passage and said second mirror being disposed adjacent said passage, such that said first mirror provides visual inspection of said work parts when said piston is in said closed position and said second mirror provides visual inspection of said work parts when said piston is in said open position; and fluid drive means for selectively driving said piston to said closed and open positions.

11. A vacuum isolating valve for an electron-bombardment welding device, said valve being disposed between an electron gun housing and a welding enclosure and comprising a valve body provided with a longitudinal chamber whose axis is perpendicular to the electron beam emitted by an electron gun positioned in said gun housing; a first channel between said gun housing and said chamber and coaxial with said electron beam; a second channel between said chamber and said enclosure and coaxial and with said first channel; a piston slidable in said channel and having a passage extending transversely through said piston; a first mechanical stop against which one end of said piston is adapted to abut, thereby to define an open valve position whereby said passage is aligned coaxially with said first and second channels; a second mechanical stop against which the other end of said piston is adapted to abut, thereby to define a closed valve position whereby said passage is offset from said first and second channels; a first mirror mounted on said piston and offset from said passage, said first mirror being in the direct line of sight with work parts in said enclosure when said valve is in said closed position; a second mirror mounted on said piston adjacent said passage, said second mirror being in the direct line of sight with work parts in said enclosure when said valve is in said open position; a sight bore in said valve body having a longitudinal axis perpendicular to the longitudinal axis of said chamber and said first and second channels; said first and second mirrors having surfaces approximately parallel to each other and each being angulated to reflect a view of said work parts to said sight bore when said valve is in said closed and open positions, respectively; and means for sliding said piston in said channel between said open and closed positions.

12. The valve of claim 11 wherein said first mirror is symmetrically disposed with respect to a plane that contains the longitudinal axis of said piston, when said piston is viewed in cross-section.

13. The valve of claim 12 wherein said second mirror is positioned to the side of said passage when said piston is viewed in cross-section.

* * * * *